(12) United States Patent
Ramesh

(10) Patent No.: US 6,541,281 B2
(45) Date of Patent: Apr. 1, 2003

(54) FERROELECTRIC CIRCUIT ELEMENT THAT CAN BE FABRICATED AT LOW TEMPERATURES AND METHOD FOR MAKING THE SAME

(75) Inventor: Ramamoorthy Ramesh, Silver Spring, MD (US)

(73) Assignee: Tachyon Semiconductors Corporation, San Jose, CA (US)

( * ) Notice: Subject to any disclaimer, the term of this patent is extended or adjusted under 35 U.S.C. 154(b) by 0 days.

(21) Appl. No.: 09/907,309

(22) Filed: Jul. 16, 2001

(65) Prior Publication Data

US 2003/0013210 A1 Jan. 16, 2003

(51) Int. Cl.⁷ ................................................ H01L 21/00
(52) U.S. Cl. ........................ 438/3; 438/672; 438/675; 257/295; 257/296; 257/303; 257/306
(58) Field of Search .............................. 257/295, 296, 257/303, 306; 438/3, 672, 675

(56) References Cited

U.S. PATENT DOCUMENTS 5,990,507 A  * 11/1999 Mochizuki et al. ......... 257/295

* cited by examiner

Primary Examiner—David Nelms
Assistant Examiner—Reneé R. Berry

(57) ABSTRACT

A circuit element that includes a ferroelectric device connected to a substrate device. The circuit element is constructed by fabricating the substrate device in a semiconductor substrate and depositing a dielectric layer over the semiconductor substrate. A via is then etched in the dielectric layer to provide access to the substrate device and filled with copper or tungsten. A layer of a conducting metallic oxide is then deposited on the conducting plug, and a layer of ferroelectric material is deposited on the layer of conducting metal oxide. The layer of conducting metallic oxide is deposited at a temperature below 450° C., preferably at room temperature.

6 Claims, 2 Drawing Sheets

FERROELECTRIC CIRCUIT ELEMENT THAT CAN BE FABRICATED AT LOW TEMPERATURES AND METHOD FOR MAKING THE SAME

FIELD OF THE INVENTION

The present invention relates to integrated circuits, and more particularly, to the integration of circuit elements involving ferroelectric layers fabricated on or over substrates containing prefabricated integrated circuit elements.

BACKGROUND OF THE INVENTION

To simplify the following discussion, the present invention will be discussed in the context of ferroelectric-based memory elements; however, it will be apparent from the following discussion that the present invention may be utilized in a variety of circuits based on ferroelectric devices. Non-volatile memories based on ferroelectric materials have been known to the art for many years. In their simplest form, such memories are based on a storage cell consisting of an isolation transistor and a capacitor having a ferroelectric dielectric layer. Information is stored in the capacitor dielectric by applying voltages that set the polarization of the dielectric layer, a polarization in one direction denoting a 1, and a polarization in the other direction denoting a 0. The isolation transistor connects or disconnects the capacitor to a bit line used to communicate the read and write signals involved in reading and writing the state of the capacitor.

Ferroelectric-based non-volatile memories provide faster write times than non-volatile memories based on EEPROM or flash memory technologies. In addition, ferroelectric-based memories may be re-written millions or even billions of times; whereas, EEPROM and flash memories are limited to typically 10,000 writes. The write limitation prevents EEPROM and flash memories from being used in a number of applications.

While the basic design and advantages of ferroelectric-based memories have been known or more than a decade, commercial devices based on this technology are still lacking. Memories based on ferroelectric devices are normally constructed in a two step process in which the ferroelectric-based capacitor is constructed over a substrate in which the isolation transistors have been fabricated using conventional CMOS technology. After the isolation transistors and other logic circuitry are fabricated on the silicon substrate by conventional semiconductor fabrication techniques, a dielectric layer, typically glass, is deposited over the substrate to protect this circuitry from damage during the subsequent capacitor fabrication steps.

The dielectric layer includes vias for making connections to the underlying silicon-based components. The connections are provided by conducting "plugs" that are deposited in these vias. The resistance of this connection contributes to the overall RC time constant, which, in turn, determines the time needed to read data from the device. The resistance is related to the aspect ratio of the vias. Hence, it is advantageous to provide vias with as large a diameter as possible to minimize the conductivity of this connection. However, large diameter vias limit the degree to which memory cells can be packed on the substrate. Accordingly any improvement must rely on finding higher conducting materials for the plugs.

In addition to providing high conductivity, the plug material must withstand the processing temperatures involved in the fabrication of the capacitors. These temperatures typically exceed 650° C. Hence, highly conductive materials such as aluminum cannot be utilized for the plugs unless the circuit design can be arranged such that the plug layers are deposited after the high processing steps. Unfortunately, such designs require the capacitors to be fabricated next to the isolation transistors as opposed to being fabricated over the isolation transistors, which increases the size of the memory cells.

Accordingly, platinum or polysilicon are the conductors of choice in prior art memory designs. While platinum electrodes and connections have been used in the prior art, the platinum causes other problems in subsequent processing. After the devices have been fabricated, the finished devices are subjected to processing steps in which the devices are exposed to hydrogen at elevated temperatures. The platinum catalyzes the breakdown of the hydrogen gas into $H^+$ ions that damage the ferroelectric dielectric. While the damage can be corrected by subsequent processing, this processing increases the cost of the devices and places additional constraints on the device design. Accordingly, it would be advantageous to be able to avoid the use of platinum in the devices.

In prior art capacitor fabrication steps, the high processing temperatures also damage the underlying CMOS circuitry to some extent. This damage reduces device yield, and hence, increases the cost of ferroelectric-based memories. The extent of the damage depends both on the processing temperatures and the length of time at which the devices are held at these temperatures. Hence, it would be advantageous to provide a fabrication system and/or device design in which both the maximum processing temperature and the exposure time are reduced.

Broadly, it is the object of the present invention to provide an improved ferroelectric-based memory and method of making the same.

These and other objects of the present invention will become apparent to those skilled in the art from the following detailed description of the invention and the accompanying drawings.

SUMMARY OF THE INVENTION

The present invention is a circuit element that includes a ferroelectric device connected to a substrate device. The substrate device is located in a semiconductor substrate that is separated from the ferroelectric device by a dielectric layer. The ferroelectric device has a bottom electrode and a ferroelectric dielectric layer, the bottom electrode being connected to the substrate device by a conducting plug that extends through a via in the dielectric layer. The conducting plug includes copper or tungsten. The via may include a diffusion barrier for preventing diffusion of the material in the conducting plug into the semiconductor substrate.

A circuit element according to the present invention is constructed by fabricating the substrate device in a semiconductor substrate and depositing a dielectric layer over the semiconductor substrate. A via is then etched in the dielectric layer to provide access to the substrate device. The via is filled with a conducting plug that includes copper or tungsten. A layer of a conducting metallic oxide is then deposited on the conducting plug, and a layer of ferroelectric material is deposited on the layer of conducting metal oxide. The layer of conducting metallic oxide is deposited at a temperature below 450° C., preferably at room temperature. The layer of ferroelectric material is deposited at a temperature below 450° C. The preferred ferroelectric material is PZT that is doped with niobium, lanthanum, tantalum or tungsten in the concentration range of 1 to 8% to provide a Curie point temperature <450° C.

DETAILED DESCRIPTION OF THE INVENTION

Figure 1:
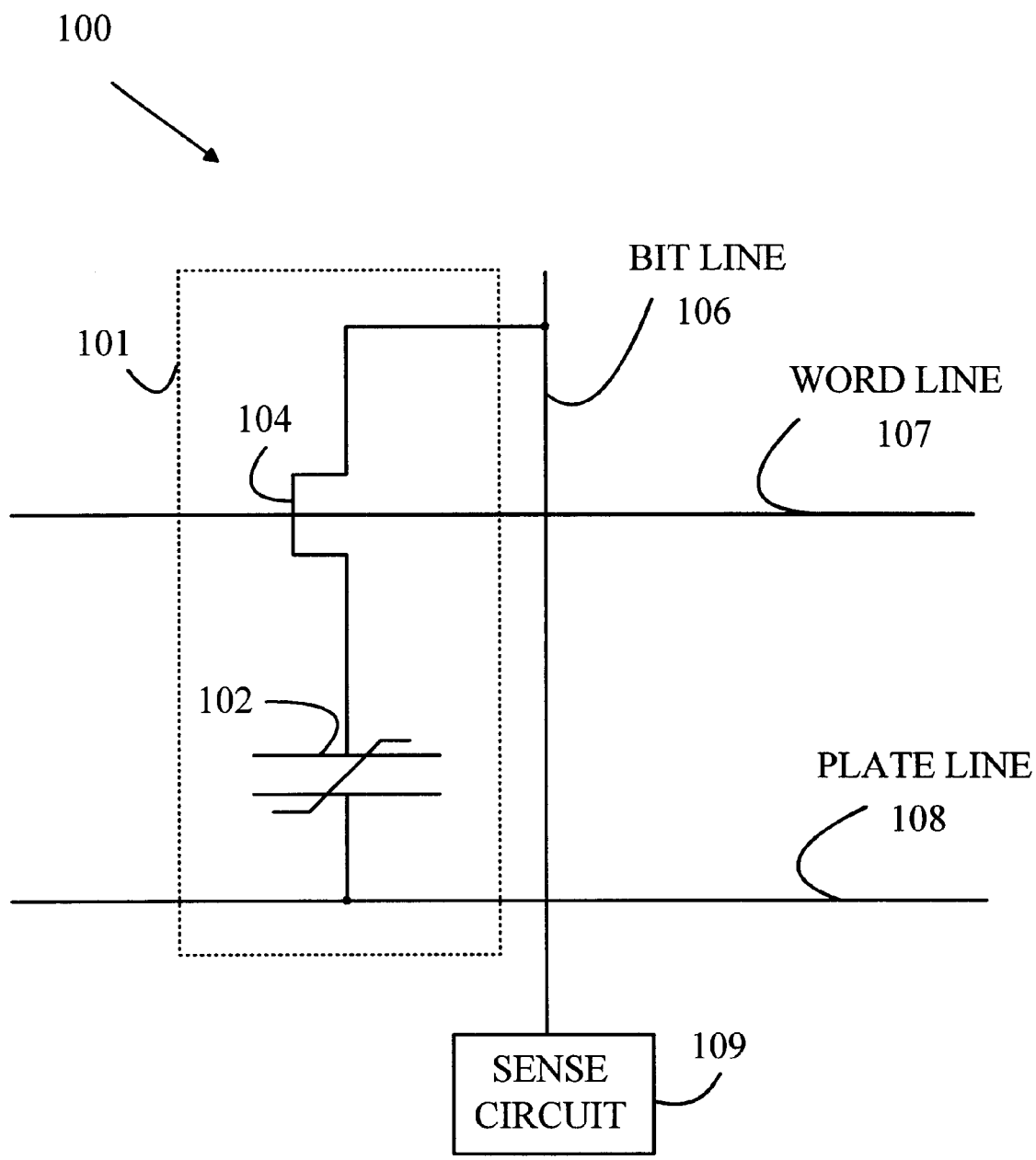
FIG. 1 is a schematic drawing of a portion of a memory 100 utilizing ferroelectric-based memory cells 101.

The present invention may be more easily understood with reference to FIG. 1, which is a schematic drawing of a portion of a memory 100 utilizing ferroelectric-based memory cells 101. Each memory cell includes an isolation transistor 104 and a capacitor 102 that has a ferroelectric material as its dielectric layer. The isolation transistor connects the capacitor between a bit line 106 and a plate line 108 in response to the appropriate logic level being introduced on wordline 107. Data is stored in ferroelectric capacitor 102 by setting the direction of polarization of the ferroelectric dielectric using signals placed on the bit and plate lines. Data is read from the memory cell by applying a predetermined potential across the ferroelectric capacitor and observing the direction of current flow on the bit line with the aid of sense amplifier 109.

Figure 2:
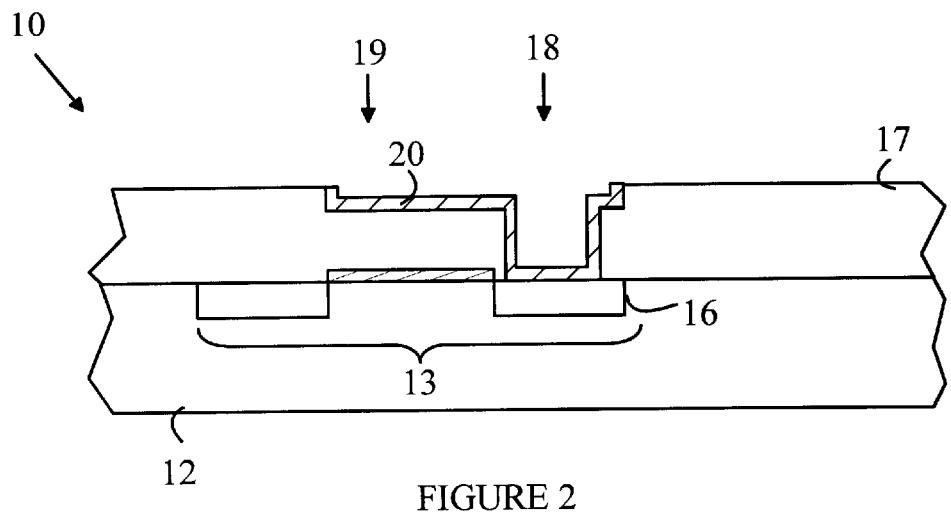
FIGS. 2–4 are cross-sectional views of a memory cell 10 according to the present invention at various stages in the fabrication process.
Figure 3:
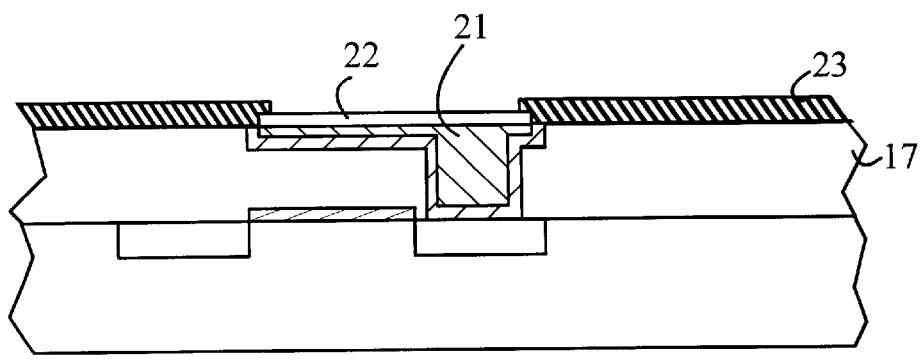
Figure 4:
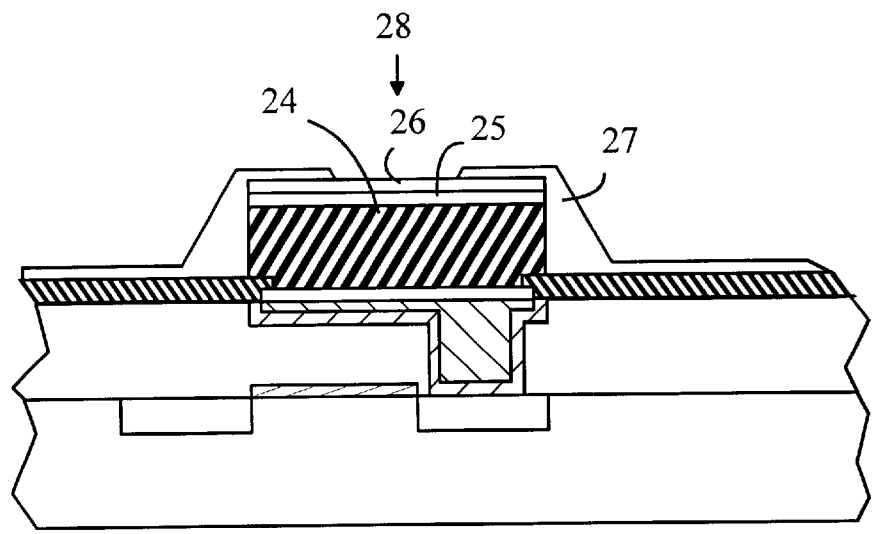

Refer now to FIGS. 2–4, which are cross-sectional views of a memory cell 10 according to the present invention at various stages in the fabrication process. The memory cell is fabricated in two phases. In the first phase, the isolation transistors and other logic circuitry such as sense amplifier 109 are fabricated on a silicon substrate 12 using conventional CMOS fabrication techniques. Since this process is conventional in the art, it will not be discussed in detail here. The isolation transistor corresponding to memory cell 10 is shown at 13. After completing the fabrication of the silicon-based circuitry, a dielectric layer 17, typically $SiO_2$, is deposited over the circuitry.

In the second fabrication phase, the ferroelectric capacitors utilized in the memory are fabricated over the substrate. First, a via 18 is opened to the drain 16 of transistor 13. If the bottom electrode of the capacitor is to be larger than this via, a depressed area 19 is provided for the extended bottom electrode. In the preferred embodiment of the present invention, the bottom electrode is constructed from copper or tungsten. When copper is utilized, a diffusion barrier 20 is provided to prevent the copper from diffusing into the underlying silicon circuitry. The diffusion barrier is preferably Ta, TaN, or WN or other ternary barrier material such as $Ta_xSi_yN_z$, $W_2 Si_yN_z$, etc. A 200–1000 A° barrier layer is preferably deposited by CVD or a physical vapor deposition process such as sputtering.

Refer now to FIG. 3. Next, the bottom electrode structure is constructed by depositing metal into the via and extension. The bottom electrode preferably includes two layers. First the via is filled with the connecting metal, i.e., copper or tungsten as shown at 21. If the metal extends beyond the via, and copper is utilized, the copper thickness is preferably less than 1 micron in the area of the extension. If thicker copper layers are utilized, the thermal stress induced during the annealing step discussed below can lead to the detachment of the copper layer from the underlying dielectric layer. In the preferred embodiment of the present invention, the copper layer is 500 Å in region 19.

Next, a conducting metal oxide layer 22 is deposited. The metal oxide layer is typically 500 Å thick and may be constructed from any conducting oxide that is compatible with the ferroelectric layer that is deposited next. If the dielectric is constructed from a lead titanium zirconate (PZT) based material, $CoLa_{1-x}Sr_xO_3$, Ru $SrO_3$, $LaNiO_3$(LNO), $VLa_{1-x}Sr_xO_3$, $SrNb_{1-x}Ti_xO_3$, $MO_2$ (where M=Ir, Ru, Mo, or Cr), or $CuLa_{2-x} Sr_xO_4$ may be utilized for the conducting oxide layer. If a $TiBa_{1-x} Sr_xO_3$ is used for the dielectric, $NiLa_{1-x} Sr_xO_3$ may also be used for the conducting oxide. In the preferred embodiment of the present invention, LNO is utilized because this material may be deposited at room temperature using sputtering, and hence, the underlying silicon-based circuitry is not exposed to elevated temperatures during this step. As noted above, minimizing the total high-temperature exposure of the underlying silicon-based circuitry improves device yield.

Next, a dielectric layer that acts as a barrier to diffusion of the components of the ferroelectric layer is deposited as shown at 23. This layer forms the bottom portion of this diffusion barrier. The diffusion barrier can be constructed from any material that will substantially inhibit the exchange of oxygen between the ferroelectric layer and the surrounding areas when the dielectric layer is subjected to elevated temperatures during the processing steps following the deposition and annealing of the ferroelectric layer. Dielectric layers based on titanium oxide, aluminum oxide, and silicon nitride may be utilized for this layer.

Referring to FIG. 4, the dielectric layer 24 is deposited next. The preferred dielectric material is PZT that has been doped with niobium, lanthanum, tantalum or tungsten in the concentration range of 1 to 8%. The particular concentrations of the components of the layer are chosen to provide a Curie point temperature of less than 450° C. Solgel precursors that provide low temperature deposition and annealing are known to the art. The reader is referred to K. Makie, et al., "Lowering of Crystallization Temperatures of Sol Gel Derived PZT Thin Films", Proc. Integrated Ferroelectrics, 35, p193. PZT layers can be constructed using these precursors without subjecting the underlying silicon-based circuitry to temperatures above 450° C. during the sintering process. However, other ferroelectric materials may be utilized including $TiBa_{1-x} Sr_xO_3$. In addition, the present invention can be utilized in piezoelectric applications if the dielectric material is $MLa_{1-x} Sr_xO_3$, where M is Cr, Co, or Ni.

After the ferroelectric dielectric layer is deposited and sintered, the top electrode 25 is deposited. The top electrode is also preferably constructed from a conducting metal oxide as described above with reference to the construction of the bottom electrode. A copper layer 26 can be included in the top electrode to reduce the resistance of the electrode. After the top electrode layers are deposited, the layers are etched to form the capacitor stack shown in FIG. 3.

Next, an oxygen impermeable dielectric layer 27 is deposited to form the top portion of the encapsulating layer that inhibits the flow of oxygen to and from dielectric layer 27. A via 28 is then opened in layer 27 to provide access for an electrical connection to the top electrode.

The above-described embodiments of the present invention have utilized a ferroelectric storage device constructed from a capacitor having a ferroelectric dielectric. However, the present invention may also be practiced with other ferroelectric storage devices. For example, ferroelectric storage devices based on ferroelectric field-effect transistors (FETs) may also be constructed according to the present invention. Such devices are well known to the art, and hence, will not be discussed in detail here. For the purposes of this discussion, a ferroelectric FET may be viewed as a ferroelectric capacitor in which the top electrode has been replaced by a layer of semiconducting material having two contacts thereon. The contacts are separated from one another. The resistance of the semiconductor layer depends on the direction of polarization of the ferroelectric layer. The two contacts are analogous to the drain and source of a conventional FET. The bottom electrode is analogous to the gate of a conventional FET.

A storage device based on a ferroelectric FET may be constructed as described above up to the point at which the top electrode is deposited. In the case of a ferroelectric FET, the top electrode is a layer of a semiconductor such as indium tin oxide, and two vias must be opened in the encapsulating layer, one for the drain contact and one for the source contact. Accordingly, the term "top electrode" as used herein includes layers of semiconducting materials.

It will also be apparent from the preceding discussion that the present invention can be utilized to construct other devices that involve ferroelectric-based devices constructed over an integrated circuit containing a substrate in which the ferroelectric device must be connected to a transistor or other device in the integrated circuit.

Various modifications to the present invention will become apparent to those skilled in the art from the foregoing description and accompanying drawings. Accordingly, the present invention is to be limited solely by the scope of the following claims.

What is claimed is:

1. A method for constructing a memory cell comprising a series combination of a transistor having a source and a drain and a ferroelectric storage device, said method comprising the steps of:

fabricating said transistor in a semiconductor substrate;

depositing a dielectric layer over said semiconductor substrate;

etching a via in said dielectric substrate, said via providing access to either said source or said drain of said transistor;

filling said via with a conducting plug comprising copper or tungsten;

depositing a layer of conducting metallic oxide on said conducting plug; and depositing a layer of ferroelectric material on said layer of conducting metal oxide.

2. The method of claim 1 wherein said layer of conducting metallic oxide is deposited at a temperature below 450° C.

3. The method of claim 2 wherein said conducting metallic oxide is chosen from the group consisting of $CoLa_{1-x}Sr_xO_3$, $Ru\ SrO_3$, $LaNiO_3(LNO)$, $VLa_{1-x}Sr_xO_3$, $SrNb_{1-x}Ti_xO_3$, $MO_2$ (where M=Ir, Ru, Mo, or Cr), and $CuLa_{2-x}Sr_xO_4$.

4. The method of claim 1 wherein said layer of ferroelectric material is deposited at a temperature below 450° C.

5. The method of claim 4 wherein said layer of ferroelectric material comprises PZT.

6. The method of claim 5 wherein said PZT is doped with niobium, lanthanum, tantalum or tungsten in the concentration range of 1 to 8%.

* * * * *